(12) United States Patent
Takeda

(10) Patent No.: US 6,643,720 B2
(45) Date of Patent: *Nov. 4, 2003

(54) DATA TRANSFER CONTROL METHOD, AND PERIPHERAL CIRCUIT, DATA PROCESSOR AND DATA PROCESSING SYSTEM FOR THE METHOD

(75) Inventor: Hiroshi Takeda, Higashiyamato (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/211,297

(22) Filed: Aug. 5, 2002

(65) Prior Publication Data

US 2002/0194446 A1 Dec. 19, 2002

Related U.S. Application Data

(60) Continuation of application No. 09/816,120, filed on Mar. 26, 2001, now abandoned, which is a continuation of application No. 09/400,999, filed on Sep. 21, 1999, now Pat. No. 6,247,073, which is a continuation of application No. 08/896,473, filed on Jul. 18, 1997, now Pat. No. 5,978,891, which is a division of application No. 08/369,722, filed on Jan. 6, 1995, now Pat. No. 5,673,398.

(30) Foreign Application Priority Data

Jan. 21, 1994 (JP) .................................. 6-21969

(51) Int. Cl.[7] .................... G06F 13/00; G06F 13/28; G06F 3/00; H04L 7/00
(52) U.S. Cl. ........................ 710/61; 710/1; 710/20; 710/29; 710/36; 710/58; 711/167; 712/40; 712/225; 713/400; 713/600

(58) Field of Search ................... 710/1, 20, 29, 710/36, 58, 61; 711/167; 712/40, 225; 713/400, 600

(56) References Cited

U.S. PATENT DOCUMENTS

| 3,893,033 A | | 7/1975 | Finch |
| 4,755,937 A | | 7/1988 | Glier |
| 4,964,141 A | * | 10/1990 | Matsushima et al. ........ 375/354 |
| 4,984,190 A | * | 1/1991 | Katori et al. ............... 709/237 |

(List continued on next page.)

FOREIGN PATENT DOCUMENTS

| JP | 60-54065 | 3/1985 |
| JP | 63-308656 | 12/1988 |

(List continued on next page.)

*Primary Examiner*—Jeffrey Gaffin
*Assistant Examiner*—Tanh Q Nguyen
(74) *Attorney, Agent, or Firm*—Mattingly, Stanger & Malur, P.C.

(57) ABSTRACT

A memory 1 performs its internal operation in response to access requests (200, 201 and 202) of a CPU 2 in synchronism with the oscillated output of a self-excited oscillator 102 incorporated therein and according to said access requests, and outputs a response request 103 for said access requests to said CPU in synchronism with its internal operation. The CPU performs the access requests for the memory, and fetches data from the outside or outputs the data to the outside in response to and in synchronism with the response request 103 from the accessed memory and according to the kinds of said access requests.

5 Claims, 15 Drawing Sheets

U.S. PATENT DOCUMENTS

| | | | |
|---|---|---|---|
| 4,984,194 A | * | 1/1991 | Hogberg ..................... 375/354 |
| 5,019,966 A | * | 5/1991 | Saito et al. ................... 710/29 |
| 5,124,589 A | | 6/1992 | Shiomi et al. |
| 5,140,680 A | | 8/1992 | Best |
| 5,159,573 A | * | 10/1992 | Yamada ................... 365/233.5 |
| 5,260,905 A | * | 11/1993 | Mori ..................... 365/230.05 |
| 5,268,865 A | | 12/1993 | Takasugi |
| 5,309,567 A | | 5/1994 | Mizukami |
| 5,371,880 A | | 12/1994 | Bhattacharya |
| 5,446,696 A | | 8/1995 | Ware et al. |
| 5,454,116 A | | 9/1995 | Harigai et al. |
| 5,457,781 A | | 10/1995 | Miller et al. |
| 5,469,549 A | | 11/1995 | Simpson et al. |
| 5,469,577 A | | 11/1995 | Eng et al. |
| 5,507,001 A | * | 4/1996 | Nishizawa ..................... 710/5 |
| 5,513,377 A | | 4/1996 | Capowski et al. |
| 5,522,088 A | | 5/1996 | Halma et al. |
| 5,524,098 A | * | 6/1996 | Holland et al. ............. 365/219 |
| 5,537,640 A | | 7/1996 | Pawlowski et al. |
| 5,724,615 A | * | 3/1998 | Ishii ........................... 710/61 |
| 5,761,735 A | | 6/1998 | Huon et al. |
| 5,805,603 A | | 9/1998 | Araki et al. |
| 5,828,869 A | | 10/1998 | Johnson et al. |
| 5,832,047 A | | 11/1998 | Farraiolo et al. |
| 5,878,281 A | * | 3/1999 | Itoh et al. ..................... 710/61 |
| 5,893,927 A | | 4/1999 | Hovis |
| 5,987,576 A | | 11/1999 | Johnson et al. |
| 6,044,032 A | | 3/2000 | Li |
| 6,052,329 A | | 4/2000 | Nishino et al. |
| 6,111,807 A | | 8/2000 | Ooishi |
| 6,192,482 B1 | | 2/2001 | Casper et al. |
| 6,253,278 B1 | | 6/2001 | Ryan |

FOREIGN PATENT DOCUMENTS

| | | |
|---|---|---|
| JP | 1-66697 | 4/1989 |
| JP | 1-81794 | 5/1989 |
| JP | 1-169654 | 7/1989 |
| JP | 2-83762 | 3/1990 |
| JP | 2-252046 | 10/1990 |
| JP | 3-20849 | 1/1991 |
| JP | H3-20849 | 1/1991 |
| JP | 4-123393 | 4/1992 |
| JP | 4-177696 | 6/1992 |
| JP | 5-216821 | 8/1993 |

* cited by examiner though they have
DATA TRANSFER CONTROL METHOD, AND PERIPHERAL CIRCUIT, DATA PROCESSOR AND DATA PROCESSING SYSTEM FOR THE METHOD This is a continuation application of U.S. Ser. No. 09/816,120, filed Mar. 26, 2001, abandoned, which is a continuation application of U.S. Ser. No. 09/400,999, filed Sep. 21, 1999, now U.S. Pat. No. 6,247,073, which is a continuation application of U.S. Ser. No. 08/896,473, filed Jul. 18, 1997, now U.S. Pat. No. 5,978,891 which is a divisional application of U.S. Ser. No. 08/369,722, filed Jan. 6, 1995, now U.S. Pat. No. 5,673,398.

BACKGROUND OF THE INVENTION

The present invention relates to a method of controlling the transfer of a variety of information such as instruction information or data information between a memory or a peripheral circuit and a data processor, and a peripheral circuit, a data processor and a data processing system using the method, and, more particularly, to a technique which is especially effective if applied to the control technique of the data transfer between the data processor and a memory. Incidentally, the data processor in the present Specification will cover the general concept of a CPU (i.e., Central Processing Unit), a microprocessor, a microcomputer, a single-chip microcomputer, a digital-signal processor or a direct memory access controller.

SUMMARY OF THE INVENTION

Some RISC processors of the prior art include one or more cache memories in a chip from the point of view of performance, cost, manufacture process and technical level of the LSI. Such a CPU is connected with a number of memories and input/output) circuits on a circit board to construct a system. It is usual to use an operation clock (or system clock) as a reference to the operation of the system. Usually, the peripheral circuits such as the memories and the input/output circuits to constitute the system are individually given different functions and characteristics to have individually different operating procedures, response times or operating speeds. It is needless to say that the CPU interfaces owned by the memories and the input/output circuits are frequently different from one another although they have some similarity in the functions or timings.

As to the differences in such functions, operating speeds and interface specifications, memory controllers are used for the memories, and I/O controllers are used for the input/output circuits. These controllers have functions, as roughly divided into the following two points.

The first function is to inform the memories and the input/output circuits of which memory or input/output circuit is selected by the CPU, and initiates a data transfer. This function can be regarded as the so-called "chip selection" or "chip enable control". For example, logic operations between the signals indicating the kinds of addressing and access are carried out to produce pulses or level signals by using an operation clock or the like thereby to activate only the memory selected or the signal connected with the input/output circuit.

The second function is to count the operation clocks by a counter thereby to produce a signal demanding the CPU for an extension of the access period at the unit of the operation clock for the wait or ready operation. Under to the rule of confirming the signal for each operation clock by the CPU, the difference in the timing or the operation speed between the CPU and the memory or the peripheral circuit is absorbed to realize the data transfer without fail. This function is the so-called "wait state control function".

However, we have revealed that the aforementioned wait state function by the controller has the following problems.

(1) Since the duration of the data transfer time to be extended by the wait state is always determined at the operation clock unit of the system, it is impossible to sufficiently extract the performance intrinsic to the memory or peripheral circuit. Moreover, it is substantially impossible to design the system by using the performance, which is based upon the design data submitted by the maker/seller as to the memory or the input/output circuit, in the limit state. Since a certain operation margin is considered, a data transfer involves idle time in most cases so that the data transfer efficiency on the data bus decreases. This problem applies not only to the case in which the system is constructed on a circuit board, i.e., in which the connections between the memories or the input/output circuits and the CPU are made through the buses on the board, but also to the case in which the CPU and the memories are formed over a common semiconductor chip. Specifically, if an optimum design were to made considering the electric characteristics and the arrangement of circuit elements, the controllers and the memories could effect the data transfer efficiently to the operation clock of the controllers. In the actual circuit design, however, a delicate timing has to be made in the chip although not easy, while considering the characteristics of the individual logic circuit blocks.

(2) The aforementioned wait state control takes serious troubles because the designer has to design the system for the individual memories or input/output circuits, if in plurality, due to the differences in the functions (including the protocol) and performances.

(3) The circuit portions required for the wait state control have to cover the sets of memories and input/output circuits, thus causing difficulties in the high speed, the small size and the low prices such as the complicatedness of the system, the increase in the part number or the increase in the load upon the signal line.

(4) As has been described in the aforementioned problem (1), the wait state control cannot sufficiently extract the performances intrinsic to the memories and the peripheral circuits so that it limits the speed-up of the operations. In order to eliminate this limit, therefore, all or the highly efficient memories or input/output circuits could be connected without the wait state control. If, however, the operation clock of the controller is suppressed according to the characteristics such as the operation speed of the memories and the input/output circuits, the controller such as the CPU has a tendency to have its operation clock speeded up to drop the value of the system. If, on the contrary, a fast memory or input/output circuit is to be used in conformity to the operation clock of the controller, an extremely high rise is caused in the system price.

Thus, the system of the prior art for producing the timing of the data transfer between the CPU and the peripheral circuit from the operation clock of the CPU or the system cannot realize the data transfer which can sufficiently exploit the intrinsic performance of the peripheral circuit such as the memory. Specifically, we have thought it difficult to desire a basic development to a high speed if the CPU and the peripheral circuit are connected by the wait state control function which stresses the reliable operation by returning the wait signal to the CPU at a timing of integer times as high as that of the operation clock on the basis of the characteristics of the peripheral circuit.

An object of the present invention is to provide a technique which is enabled to effect a data transfer by sufficiently exhibiting the intrinsic characteristics owned by a peripheral circuit such as a memory.

Another object of the present invention is to provide a peripheral circuit for producing a timing of the data transfer according to its own characteristics.

A further object of the present invention is to provide a data processor capable of transferring data efficiently with such peripheral circuit.

A further object of the present invention is to provide a data processing system capable of transferring data fast with the data processor by sufficiently exhibiting the intrinsic characteristics owned by the peripheral circuit such as the memory.

The aforementioned and other objects and novel features of the present invention will become apparent from the following description to be made with reference to the accompanying drawings.

A representative of the invention to be disclosed herein will be briefly described in the following.

Specifically, as represented in FIG. 1, a memory (1) acting as a peripheral circuit performs its internal operation in accordance with access requests (200, 201 and 202) from a CPU (2) exemplifying the data processor, and in synchronism with the output signal of a self-excited oscillator (102) incorporated therein; and outputs a response requests (103) to the data processor in synchronism with that internal operation in response to the access requests.

The data processor sends an access request to a desired peripheral circuit; and transfers data to or from the peripheral circuit depending on the type of the access request in synchronism with a response request received from the peripheral circuit.

The control of the data transfer between the data processor and the peripheral circuit comprises the steps of sending an access request to the peripheral circuit from the data processor; allowing the peripheral circuit to perform its internal operation according to the access request in synchronism with the output signal of a self-excited oscillator incorporated therein; sending a response to the peripheral circuit from the data processor in synchronism with its internal operation in response to the access request; and transferring data to or from the data processor depending on the type of the access request in synchronism with said response request.

In order to realize the aforementioned means with the minimum number of circuits to be added to the construction of the existing data processor or peripheral circuit, the access requests can contain the information (200 and 201) for indicating that the peripheral circuit is selected as the object to be accessed and the data transfer direction, and the response request can contain the signal (103) to be changed in synchronism with the internal operation of the peripheral circuit.

In order to construct the peripheral circuit having the aforementioned functions relatively simply, as representatively shown in FIG. 5, the peripheral circuit includes a cycle timing generator (1010) for producing an access cycle signal (1013) of the internal operation in response to the access request from the data processor and on the basis of an output signal of the self-excited oscillator (102); an external terminal (AC) for outputting the access cycle signal as the response request to the outside; and an internal timing generator (1011) for producing an internal operation timing signal in synchronism with the access cycle signal (103).

In case such peripheral circuit is constructed as a burst readable memory (capable of reading a continuous data of a plurality of words), there may be added a counter (or burst counter) (105) for counting the number of continuous data read words from the memory cell array on the basis of the change in the access cycle signal to stop the oscillations of the self-excited oscillator when the counted result reaches a predetermined count value, as representatively shown in FIG. 6. At this time, in order to set the number of continuous data read words programmably, the counter is equipped with a parameter register (1051) for latching the predetermined count value presettably from the outside, as representatively shown in FIG. 12. This parameter register can be positioned such that in case the counter has storage stages corresponding to its bit count, the memory stages are used as a substantial parameter register in a presettable manner.

In order to transfer data at different transfer rates quickly and efficiently between the internal unit and the outside, the data processor having the aforementioned functions is equipped, as representatively shown in FIG. 8, with a buffer memory (206) which includes: a asynchronous port (2064) for writing/reading on the basis of the response request; and a synchronous port (2065) for writing/reading in synchronism with the internal operation clock. The synchronous port of the buffer memory is connected as the internal unit to an arithmetic unit or register, and the asynchronous port of the buffer memory is connected with an input/output buffer circuit (205) to be interfaced with the outside. At this time, in order that the data transferred from the peripheral circuit to the buffer memory may be quickly used for the operation of an internal unit (204), the buffer memory may be equipped with a counter circuit (2066) for counting the number of continuous read accesses, which are sent to the peripheral circuit from the access control circuit, in terms of the number of changes in the response request, so that the resultant detection result may be fed as the information meaning the complete of the read data acquisition by said access request (i.e., the output information of an AND gate 2063R5, as representatively shown in FIG. 9) to the central processing unit. The buffer memory should not be limited to a perfect dual port but may be used as an apparent dual port for operating a unit-port buffer memory in a time sharing manner.

When the data processor is interfaced with a plurality of peripheral circuits of different kinds, one input terminal of the data processor for response request is connected through an OR gate or a wired OR so that it may be shared among the output terminals of each peripheral circuit for the response request, as representatively shown in FIG. 14.

In order that mutually identical peripheral circuits having a multi-bit input/output function of 1/2n bits for the number of bits of the data bus may be interfaced with the data processor, the data processor may be provided with a plurality of sets of buffer memories (206U and 206L) each having: an asynchronous port for writing/reading in response to the response request; and a synchronous port for writing/reading in synchronism with the internal operation clock, as representatively shown in FIG. 13.

According to the means described above, the peripheral circuit is operated synchronously with the output signal of the self-excited oscillator intrinsic thereto but asynchronously from the operation clock signal of the data processor requesting access to the peripheral circuit. In this relation, the mutual interface of data is realized by the mutually equivalent access requests and the response requests for the former. As a result, the time period for the series of data transfer, which as been limited to integer times as high as that of the fundamental operation clock of the data processor of the prior art, is determined according to the clock cycle of the response request depending upon the intrinsic self-excited oscillation frequency which is produced according to the characteristics such as the operation speed of the peripheral circuit such as the memory. As a result, the data transfer can be easily realized for the individual characteristic limit time periods of the peripheral circuit and the data processor. In other words, it is possible to reduce the spare time period which has been established for synchronization with the operation clock of the data processor, as has been troubled in the prior art. Moreover, the wait state control circuit for the interface between the data processor and each peripheral circuit can be dispensed with to simplify the circuit connecting means.

The data processor equipped on-chip with the buffer memory to be interfaced with the peripheral circuit can internally absorb the difference in the data transfer rate between the internal unit of the data processor and the outside to require no sequential wait time for reading/writing the data in response to the access request.

DESCRIPTION OF THE PREFERRED EMBODIMENTS

Figure 1:
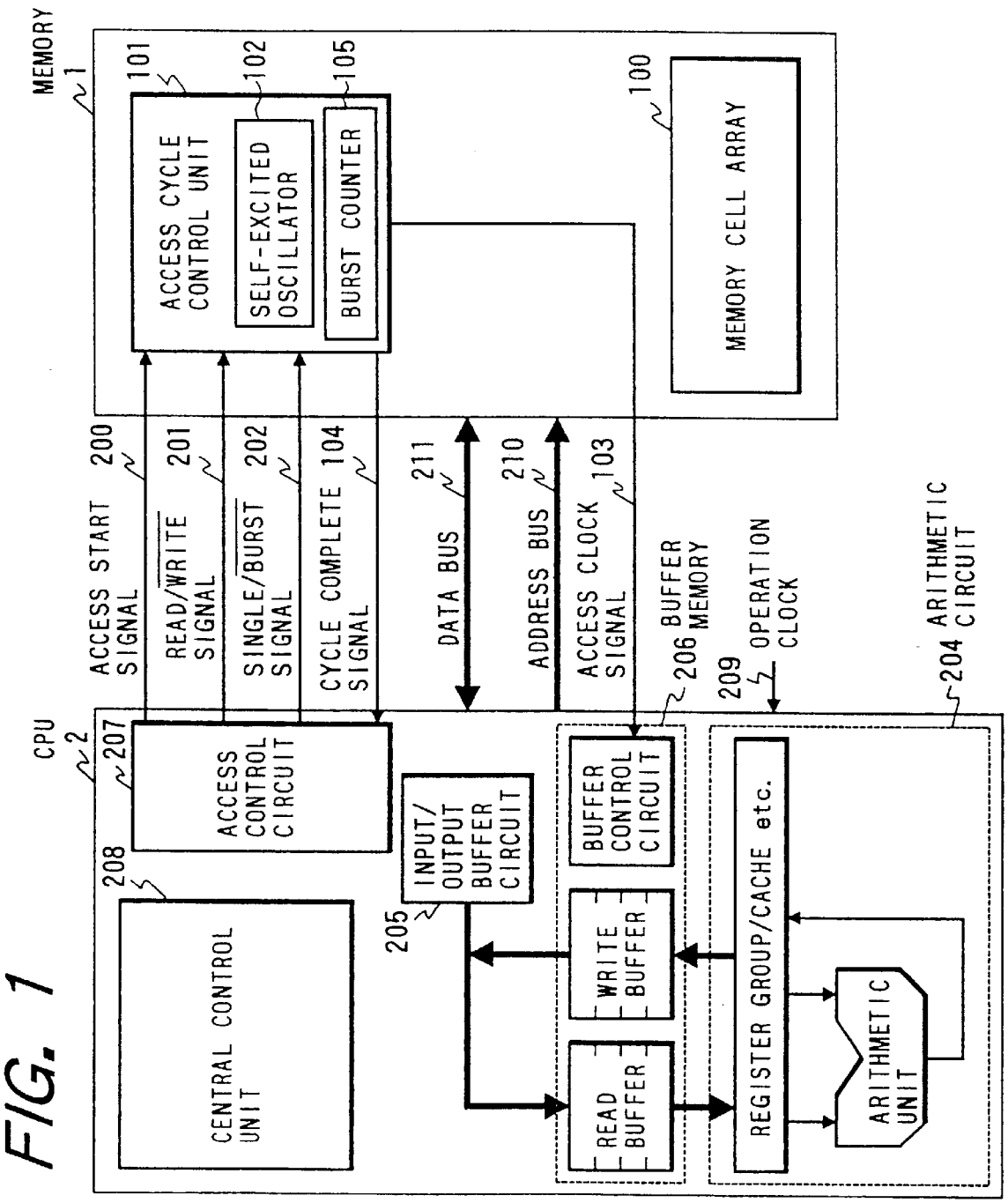
FIG. 1 is a system block diagram showing a CPU according to one embodiment of a data processor of the present invention and a memory according to one embodiment of a peripheral circuit of the present invention.

FIG. 1 shows a CPU according to one embodiment of a data processor of the present invention and a memory according to one embodiment of a peripheral circuit of the present invention such that the CPU and the memory are connected.

A memory 1, as shown in FIG. 1, is formed on a semiconductor substrate and includes a memory cell array 100 and an access cycle control unit 101, as representatively illustrated. In response to access requests (200, 201 and 202) from a CPU 2, the memory 1 performs read operations or write operations in synchronism with an oscillation output signal of a self-excited oscillator 102 incorporated therein, and outputs a response request (103) responding to the access requests to the CPU 2 in synchronism with its internal operations.

The CPU 2, as shown in FIG. 1, is formed on a semiconductor substrate and includes an arithmetic circuit 204; a buffer memory 206 having its one port coupled to the arithmetic circuit 204; an input/output buffer circuit 205 coupled to the other port of the buffer memory 206 and an external data bus 211; an access control circuit 207 for sending access requests to the external memory 1 and other peripheral circuits (not shown); and a central control unit 208 for controlling the entire operations of the central processing unit such as an instruction executing sequence control circuit or an interrupt control circuit. The CPU 2 sends the access requests (200, 201 and 202) to a desired peripheral circuit such as the memory 1 and receives the response request (103) of the peripheral circuit such as the memory 1 to latch the data in the buffer memory 206 from the outside or to output the data from the buffer memory 206 to the outside in synchronism with the response request and according to the kind of said access request. The memory 1 is operated in synchronism with the output signal of its own self-excited cillator 102. On the other hand, the CPU 2 is operated in synchronism with an operation clock 209 of the system.

In case the CPU 2 gains access to the memory 1, the start of this access is transmitted to the memory 1 by the access start signal 200. This access start signal 200 is deemed as a signal equivalent to a chip selecting signal by the memory. According to the present embodiment, the access control circuit 207 has a function as a chip selecting controller, although not especially limited thereto. This function can be replaced by a decoder for decoding several more significant bits of the address signal outputted from the CPU 2 to the outside, to produce the chip selecting signal. In any case, reference is made to both an address assigned to the peripheral circuit to be accessed and an address to be made in the CPU 2. In this sense, an access request to the peripheral circuit such as the memory, such as an instruction of the access start is sent directly or indirectly by a circuit portion for making the access address, and the access control circuit is understood to contain such circuit portion.

The direction of data transfer is instructed by the read/write signal 201. The "read" means the data transfer from the peripheral circuit such as the memory 1 to the CPU 2, and the "write" means the data transfer from the CPU 2 to the peripheral circuit such as the memory 1. According to the present embodiment, the location of the data in the peripheral circuit, as requested for access, is designated by the address signal fed to an address bus 210. The number of words for data transfer is instructed by the instruction signal (i.e., single/burst signal) 202 in a single mode/burst mode. Without the burst mode or the continuous data transfer mode, the single/burst signal 202 can be eliminated.

Upon detecting the access request in terms of the access start signal 200, the access cycle control unit 101 produces the internal access cycle signal on the basis of the output signal of the self-excited oscillator 102. Inside of the memory 1, the read or write operations instructed by the read/write control signal 201 are performed in synchronism with the access cycle signal. Outside of the memory 1, moreover, this access cycle signal is outputted as the access clock signal 103 to the CPU 2. This access clock signal 103 is a clock signal intrinsic to the memory 1 and is fed to the CPU 2 as the response request in response to the access request from the CPU 2.

Figure 2:
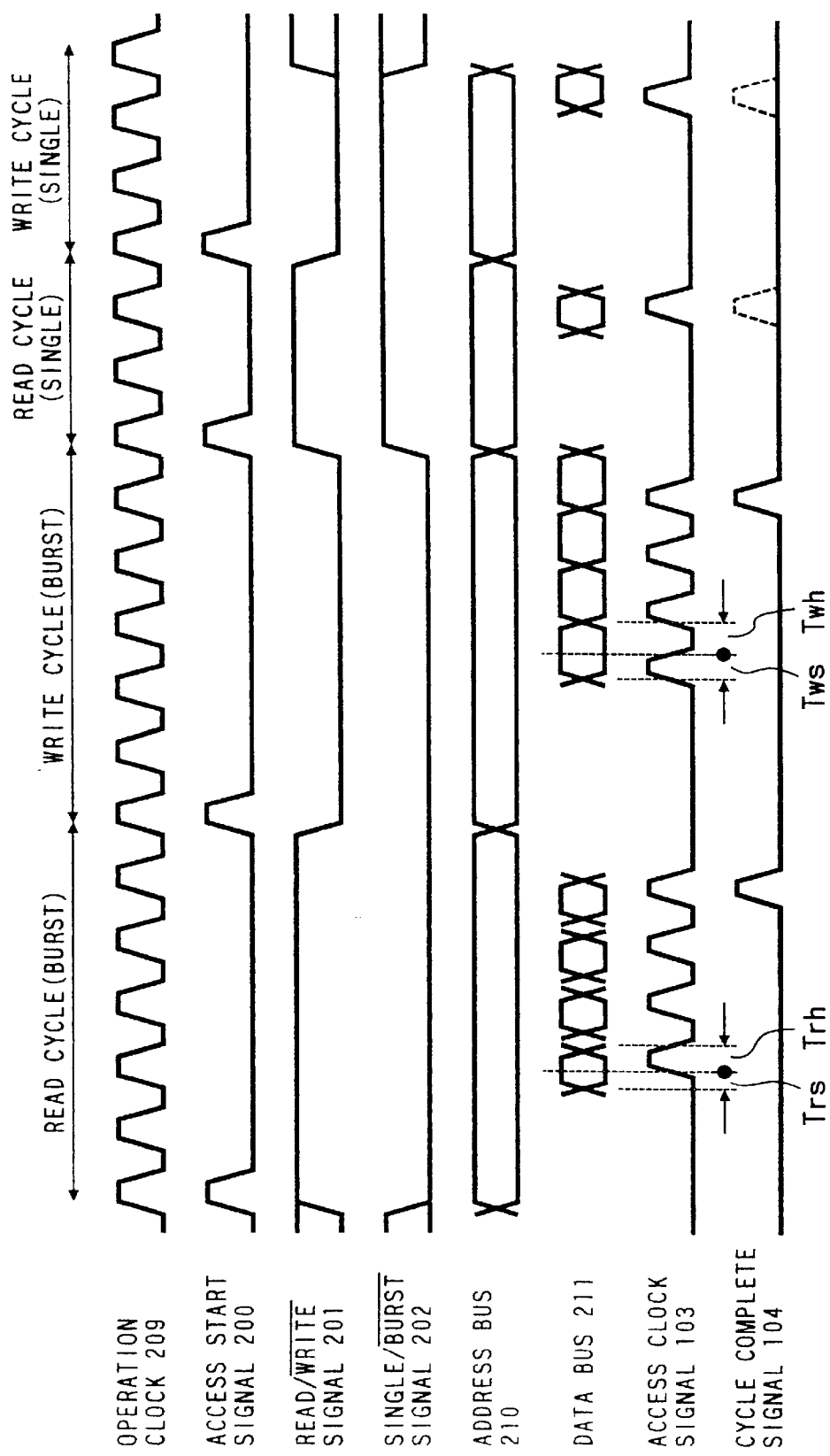
FIG. 2 is a timing chart showing one example of data transfer operations in the system of FIG. 1.

FIG. 2 shows the relations between the data output of the memory 1 in the read operation and the data output timing of the CPU 2 in the write operation, and the access clock signal 103. According to FIG. 2, when instructed to perform the read operation, the memory 1 outputs, the desired data to the data bus 211 at a timing for ensuring a setup time (Trs)/a hold time (Trh) for the rising edge of the access clock signal (or the access cycle signal in the memory). That data is latched by the CPU 2 in the buffer memory 206 at the rising edge of the access clock signal 103. In the writing operation, the CPU 2 outputs the data from the buffer memory 206 to the data bus 211 so as to ensure a setup time (Tws)/hold time (Twh) for the fall of the access clock signal 103. The memory 1 latches that data at the falling edge of the access cycle signal. Incidentally, the write operation can refer to the rise of the access clock signal 103.

According to the embodiment of FIG. 1, the access cycle control unit 101 outputs a cycle complete signal 104 for informing the CPU 2 of the complete of the continuous data transfer in the burst mode. In the access control unit 101, the number for words transferred is counted by a burst counter 105 in terms of the access cycle signal equivalent to the access clock signal 103 so that the count-up state is outputted as the cycle complete signal 104. This cycle complete signal 104 may be replaced by an identical function at the side of the CPU 2. Specifically, a burst counter for counting the access clock signal 103 may be disposed at the side of the CPU 2.

Figure 3:
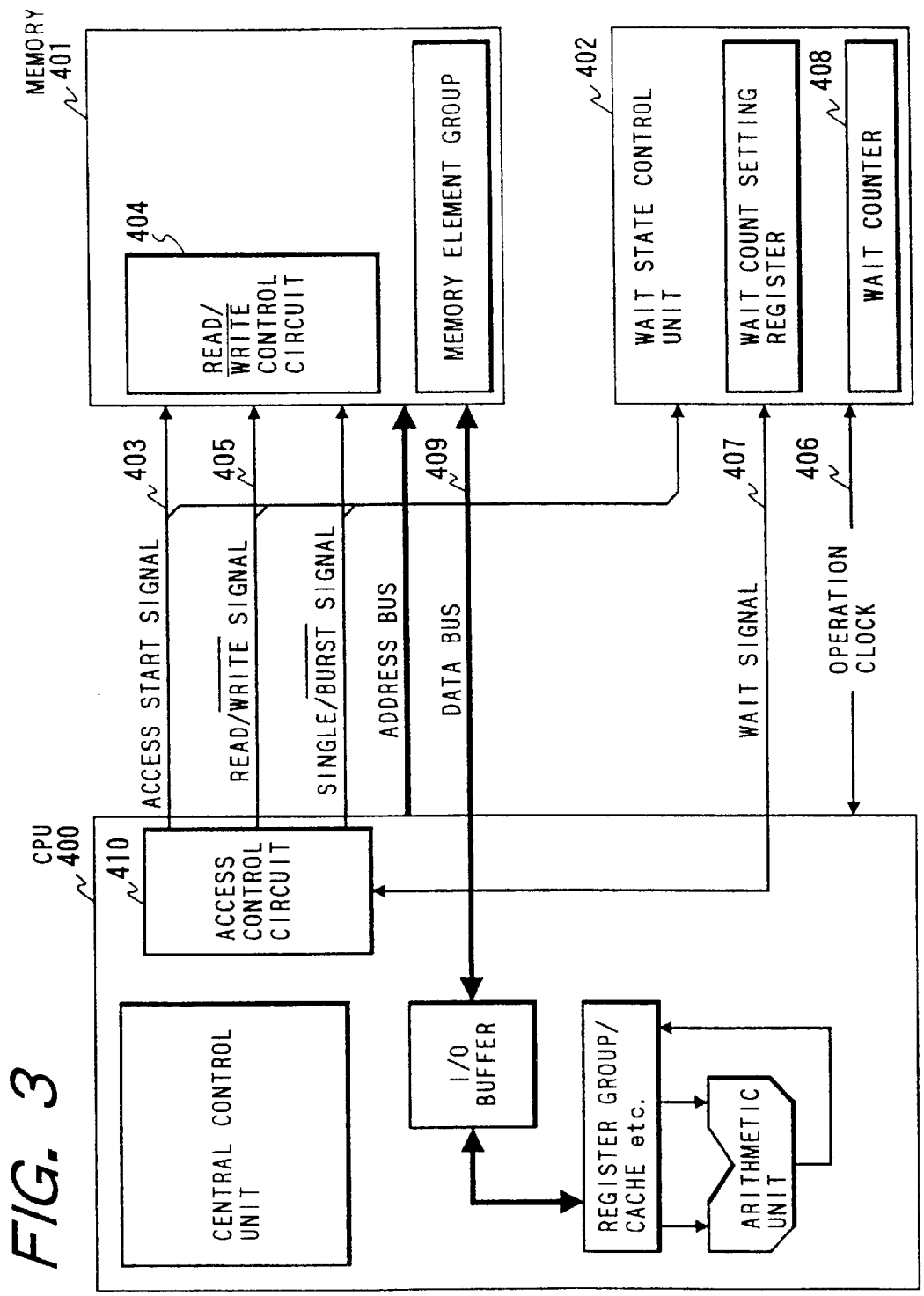
FIG. 3 is a block diagram showing a system making a data transfer possible through a wait state control unit with reference to the embodiment of FIG. 1.
Figure 4:
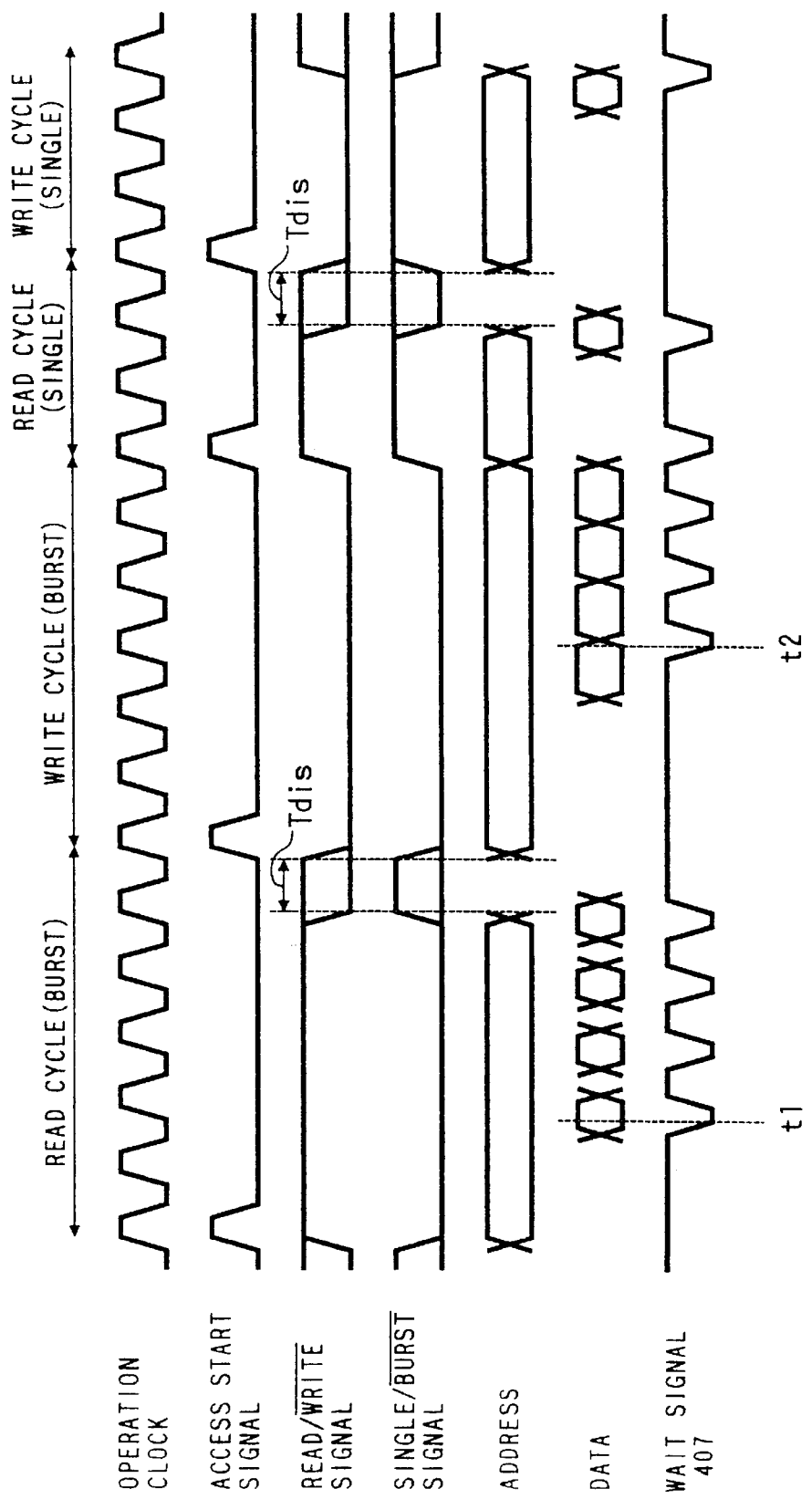
FIG. 4 is a timing chart of the data transferring operations of FIG. 3.

FIG. 3 is a block diagram showing a system making a data transfer possible through a wait state control unit, in comparison with the foregoing embodiment, and FIG. 4 shows a data transfer timing of the system.

In case a CPU 400 is to transfer data to an external memory 401, as shown in FIG. 3, the start of this data transfer is noticed in terms of an access start signal 403 to the memory 401 and a wait state control unit 402. Upon reception of the access start signal 403, a read or write operation is started according to a read/write signal 405 by a read/write control circuit 404. In synchronism with this, the wait state control unit 402 also interprets the access start signal 403 and the read/write signal 405 and starts the counting of a wait counter 408 to produce a wait signal 407 for indicating an access complete on the basis of an operation clock 406 identical to that of the CPU 400. In the reading operation, the memory 401 can output the data to be read to a data bus 409 after a time period guaranteed by its maker/seller has elapsed. In the write operation, the memory 401 can latch the data of the data bus 409 outputted by the CPU 400, after the time period guaranteed by its maker/seller has elapsed. The complete of the read operation or write operation after lapse of the time period guaranteed by the maker/seller is usually transmitted to the CPU 400 in terms of a change of the wait signal 407 to a False in synchronism with the operation clock 406 of the CPU 400 (or the wait signal is confirmed at the CPU side in synchronism with the operation clock in case it is an asynchronous signal). If the wait signal is set in the read operation to the false (or a low level) at a time t1, as shown in FIG. 4, the CPU reads the data from the data bus. If the wait signal is set in the write operation to the false (or the low level) at a time t2, the CPU confirms that the data to be written has been latched in the memory, and stops the outputting of the write data.

It is apparent from the timings of FIG. 4 that the locations (or timings) of setting the wait signal to the false are usually different between the read cycle and the write cycle. In the burst mode, moreover, the wait signal should naturally be cyclically produced in series of transfer words, in which the interval of occurrence of a first word is different from those of second and later words. As a result, the CPU 400 completes a series of read or write cycles, when it confirms the change in the wait signal 407, to keep the access control circuit 410 in the standby state till the next cycle starts. Moreover, a changing time, as indicated at Tdis in FIG. 4, is required when the read cycle and the write cycle in the identical operation mode are to be interchanged. This is because the wait signal is confirmed in synchronism with the clock. Thus, the data transfer making use of the wait signal has to take a complicated control and an unnecessary time period.

The following operational effects can be obtained according to the embodiment thus far described.

(1) In the present embodiment shown in FIGS. 1 and 2, the locations of starting the production of the access cycle by the peripheral circuit such as the memory and the timings for updating the changes are usually different between the read cycle and the write cycle, but the CPU may be dedicated to the inputting/outputting of data in accordance with the change in the access clock signal 103 without considering any of those complicated timings. In short, the data transfer at the complicated timings can be realized without the wait state control unit which has been indispensable in the prior art. This realization naturally covers both the single transfer and the burst transfer.

(2) Without the wait state control unit, the data transfer can be achieved by the access clock signal outputted from the peripheral circuit such as the memory, to reduce the access cycle time period and improve the bus using efficiency. Specifically, the peripheral circuit such as the memory is operated in synchronism with the output signal oscillated by its own self-excited oscillator 102 and asynchronously of the operation clock signal 209 of the CPU which sends an access request to that peripheral circuit, so that the interface between their data is realized the mutually equivalent access requests and the response requests to the access requests. As a result, a series of data transfer time periods, which have been limited in the prior art to an integer times as high as the fundamental operation clock of the data processor such as the CPU, can be determined according to the clock cycle of the response request depending upon the intrinsic self-excited oscillation frequency which is produced according to the characteristics such as the operating speed of the peripheral circuit such as the memory. As a result, it is easy to realize the data transfer for the limit time periods of the individual characteristics of the peripheral circuit and the CPU. In other words, it is possible to reduce the unnecessary time period which has been consumed for synchronization with the operation clock of the CPU, as has been troubled in the prior art.

(3) The CPU 2 is equipped on the common chip with the buffer memory 206 to be interfaced with the peripheral circuit so that the difference in the data transfer rate between the internal unit 204 of the CPU and the outside can be internally absorbed to prevent any sequential standby between the time periods for processing the read data and the write data by the access request.

(4) The data transfer type according to the foregoing embodiment can be widely interpreted to give a bus right to the memory if locally considered. Specifically, it is thought that the system operates with the operation clock 209 of the CPU 2 at the start of the data transfer but with the operation clock 103 of the memory during the data transfer, and the but right seems to be dynamically transferred. This concept is thought to have an effective meaning especially when the degree of integration of the LSI is improved in the future so that the logic function merges into the memory.

Figure 5:
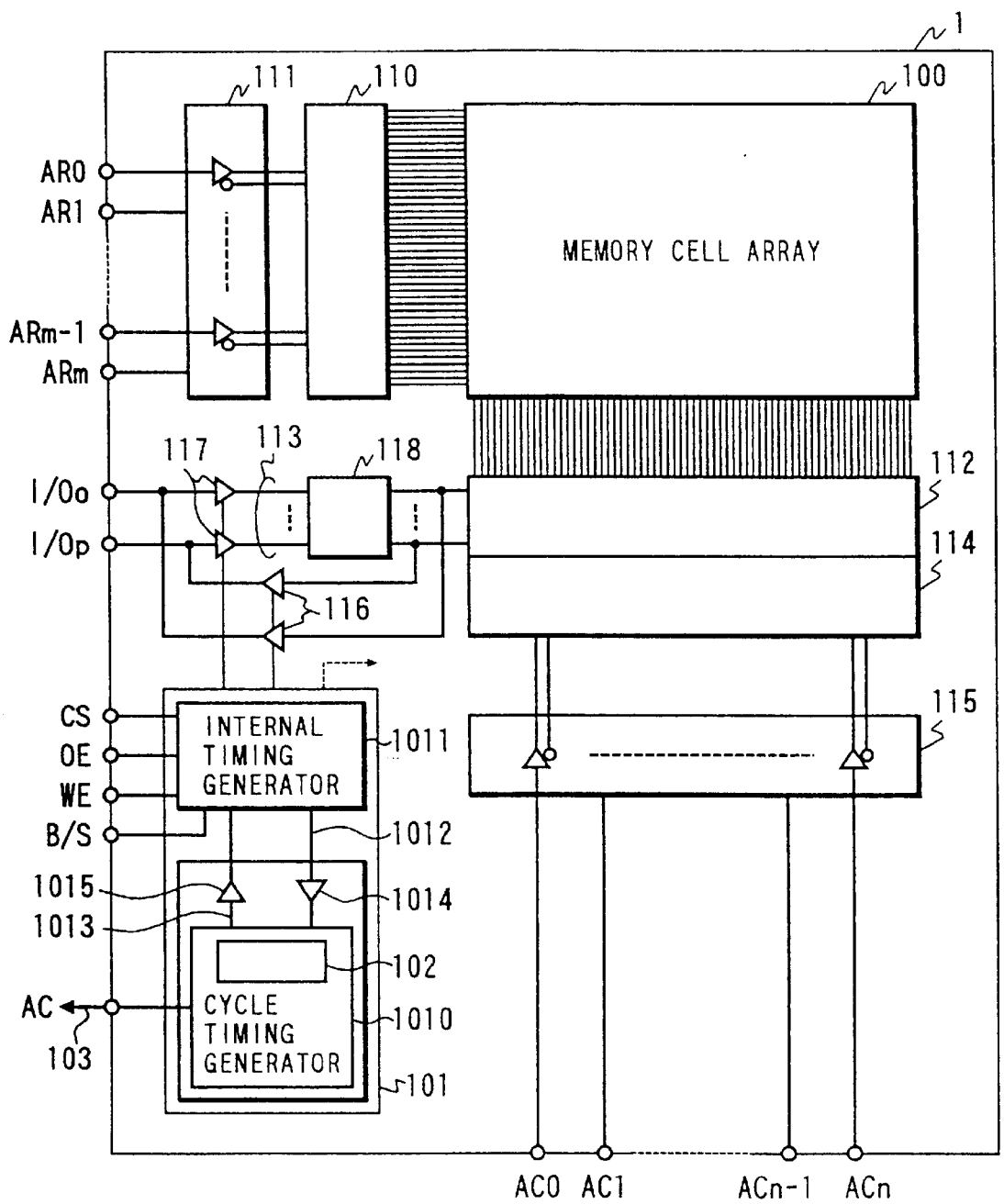
FIG. 5 is a block diagram showing one embodiment of the memory of FIG. 1.

FIG. 5 is a block diagram showing one embodiment of the aforementioned memory. The memory 1, as shown in FIG. 5, is formed as a static random access memory (i.e., SRAM) over one semiconductor substrate made of single crystalline silicon by the well-known semiconductor integrated circuit manufacturing technique, although not especially limited thereto.

The shown memory 1 includes input terminals AR0 to ARm of a row address signal; input terminals AC0 to ACn of a column address signal; data input/output terminals I/O0 to I/Op; a chip select signal input terminal CS; an output enable signal input terminal OE; a write enable signal input terminal WE; an access cycle signal output terminal AC; a burst/single change signal input terminal B/S; and a supply terminal (not shown). In connection with FIG. 1: the chip select signal input terminal CS is fed with the access start signal 200; the output enable signal input terminal OE is fed with a read signal composing the read/write signal 201; the write enable signal input terminal WE is fed with a write signal composing the read/write signal 201; and the access cycle signal 103 is outputted from the access cycle signal output terminal AC.

The memory cell array 100 includes static memory cells arranged in a matrix, whose select terminals are connected through word lines to the outputs of a row address decoder 110. This row address decoder 110 receives and decodes the internal complementary address signal, which is converted from the row address signal fed from the out side and are outputted from a row address buffer 111, to drive one word corresponding to the row address signal, to a select level. The bit lines connected to the data input/output terminals of the memory cells are commonly connected with a common data line 113 through a column switch circuit 112. The selection of the bit line to be connected to the common data line 113 is accomplished by the column switch circuit 112 in response to the output of a column address decoder 114. This column address decoder 114 receives and decodes the internal complementary address signal, which is converted from the column address signal fed from the outside and is outputted from a column address buffer 115, to select the bit line by the column switch circuit 112. Reference numeral 116 designates a sense amplifier and an output buffer circuit for amplifying the data read from the memory cells to the common data line 113 and outputting the amplified data to the outside. The sense amplifier and output buffer circuit have their input connected to the common data line 113 and their output connected to the data input/output terminals I/O0 to I/Op. Numeral 117 designates an input buffer for inputting the write data fed to the data input/output terminals I/O0 to I/O, and the input buffer 117 has its output connected to the common data line 113. Numeral 118 designates either latch circuit or a data control circuit for equalizing or precharging the common data line.

The access control unit 101 is equipped with a cycle timing generator 1010 and an internal timing generator 1011. This internal timing generator 1011 is connected to the input terminals CS, OE, WE and B/S to determine the internal operation mode by detecting the access start, deciding the read/write operation and deciding the burst mode/single mode, to produce an internal operation timing signal corresponding to the operation mode in synchronism with the access cycle signal fed from the cycle timing generator 1010. On the basis of the instruction of the access start signal fed from the CS terminal, the cycle timing generator 1010 produces a cycle timing signal 1013 and the access clock signal 103 in synchronism with the signal fed from the internal timing generator 1011 on the basis of the output signal from the self-excited oscillator 102. Incidentally, a delay circuit 1014 is used to adjust the phase of the self-excited oscillating output, and a delay circuit 1015 is used to match the phases of the access clock signal 103 outputted from the outside and the cycle timing signal 1013.

Figure 6:
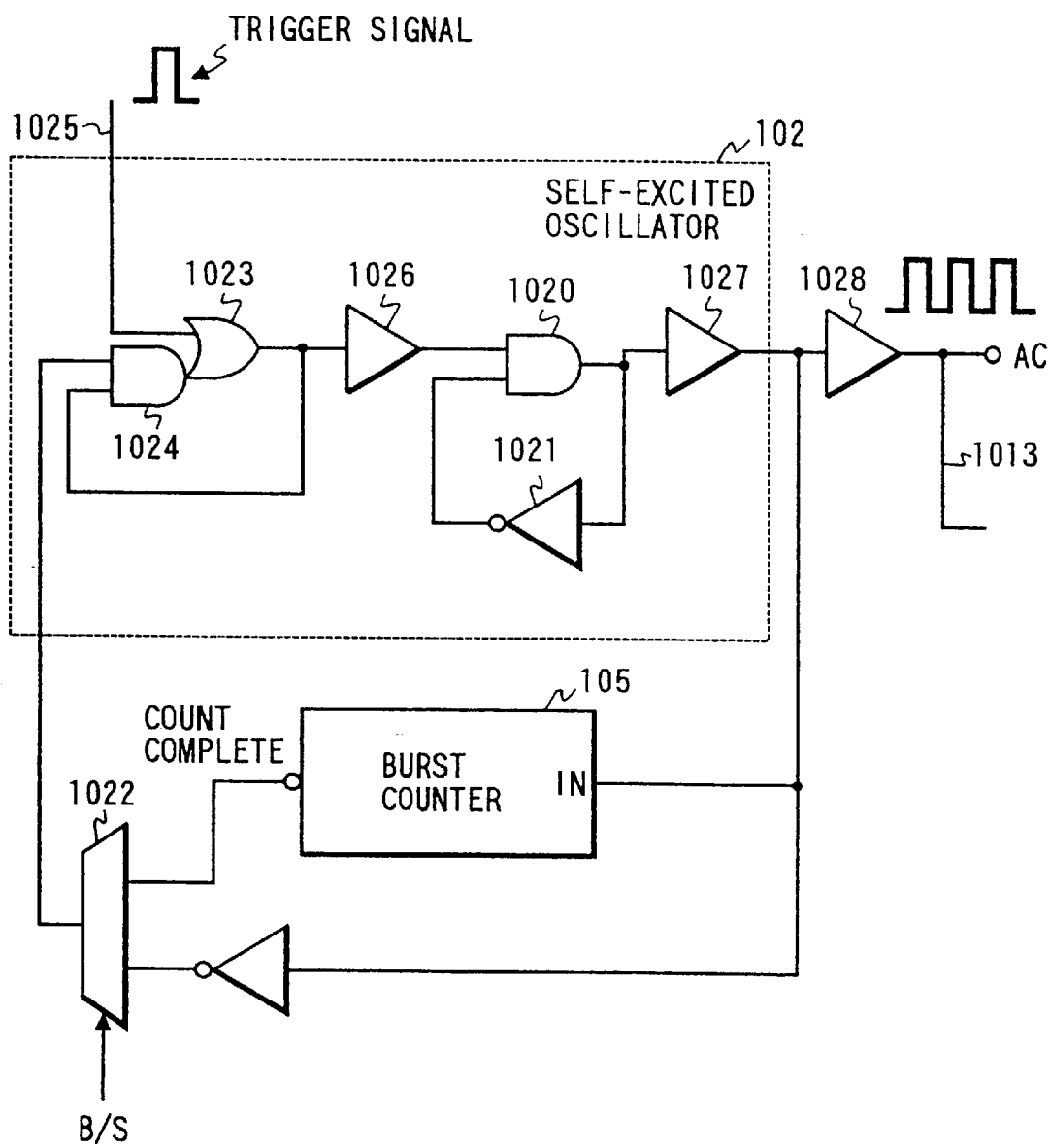
FIG. 6 is a circuit diagram showing one detailed example of a cycle timing generator of FIG. 5.

FIG. 6 shows one detailed example of the cycle timing generator 1010. The self-excited oscillator 102 has a feedback loop composed of a two-input AND gate 1020 and an inverter amplifier 1021 for feeding back the output of the AND gate 1020 to one of the inputs of the same AND gate 1020, although not especially limited thereto, and a trigger for controlling the oscillation and its stop is connected with the other input of the AND gate 1020. The trigger circuit is equipped with an AND gate 1024, to which is inputted the output of a selector 1022 to be set to a high level at an initial state and to which is fed back the output of an OR gate 1023. This OR gate 1023 receives both the output of the AND gate 1024 and a trigger signal 1025 such as a one-shot pulse to be fed in synchronism with the read or write operation from the internal timing generator 1011, and feeds its output to the AND gate 1020. Incidentally, reference numerals 1026 to 1028 designate waveform shaping elements (or delay elements). This self-excited oscillator 102 outputs a low level in the initial state. When the trigger signal 1025 is changed in this state by the one-shot pulse, oscillations are established in the feedback loop which is composed of the AND gate 1020 and the inverter amplifier 1021. This oscillating state is continued till the output of the selector 1022 is changed into pulses at the low level to set the output of the OR gate 1023 to the low level.

In the construction of FIG. 6, the burst counter 105 and the selector 1022 are used to stop the oscillator. The selector 1022 is fed with either the B/S signal or an equivalent internal signal to select the output of the waveform shaping element 1027 in the single mode. Thus, in the single mode, the self-excited oscillator 102 stops the oscillating operation by changing the access clock signal 103 and the cycle timing signal 1013 by one cycle. In the burst mode, the output of the burst counter 105 is selected. This burst counter 105 counts the number of data words read continuously from the memory cell array on the basis of the change in the output pulses of the waveform shaping element 1027, and outputs a one-shot pulse which will change from the high level to the low level such that the counted result reaches a predetermined value (i.e., a target number of words for burst transfer). As a result, the oscillating operation of the self-excited oscillator 102 is stopped when the access cycle corresponding to the target number of words in the burst mode is established.

Figure 7:
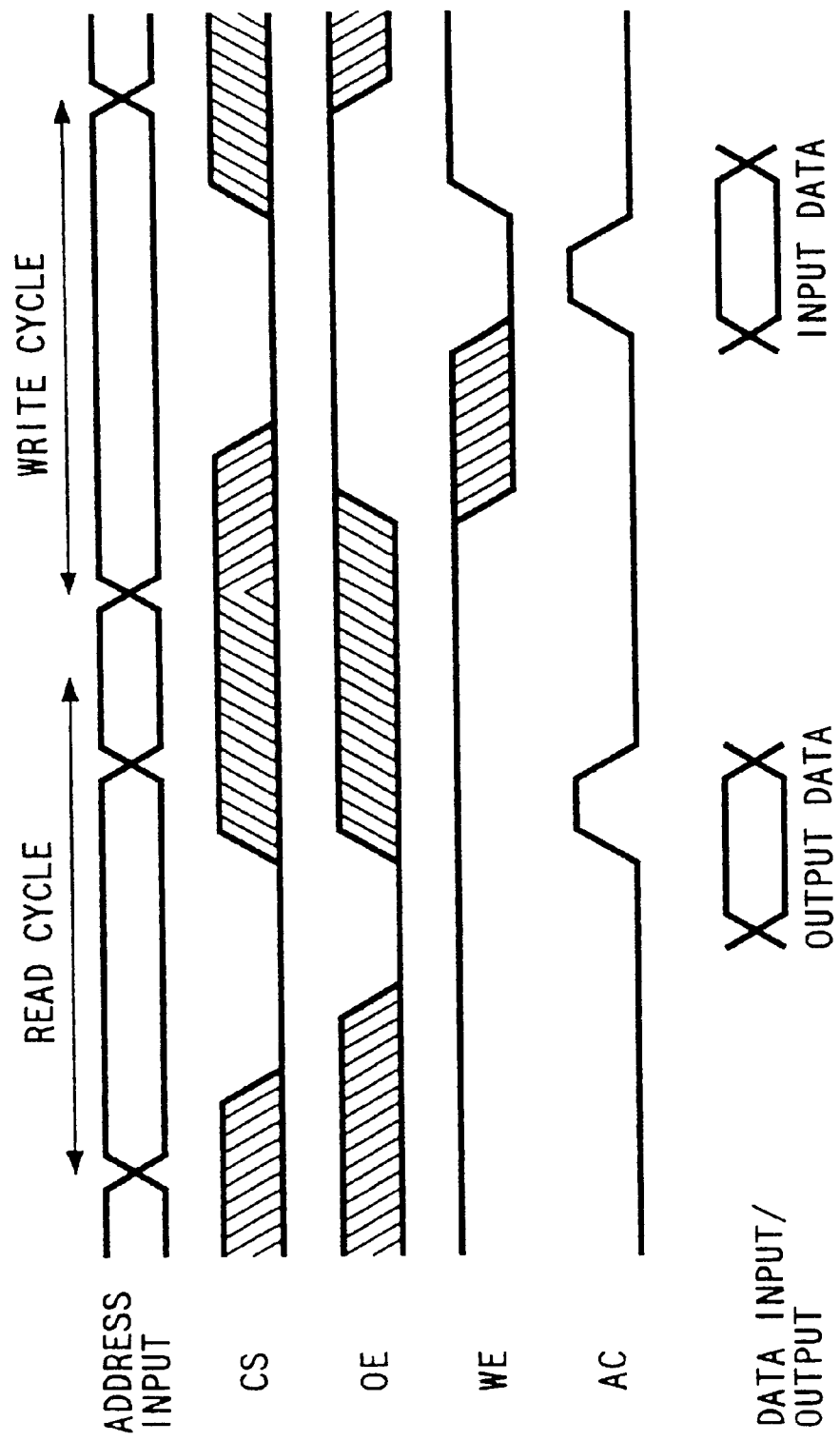
FIG. 7 is a operation timing chart of one example of the memory of FIG. 6.

FIG. 7 shows one example of the operation timing chart of the memory of FIG. 6. As shown, in the read cycle, the access cycle signal output terminal AC is changed in synchronism with the timing at which the read data is outputted.

In the write cycle, on the other hand, the write data is fed from the CPU in synchronism with the timing at which the access cycle signal output terminal AC is changed.

Figure 8:
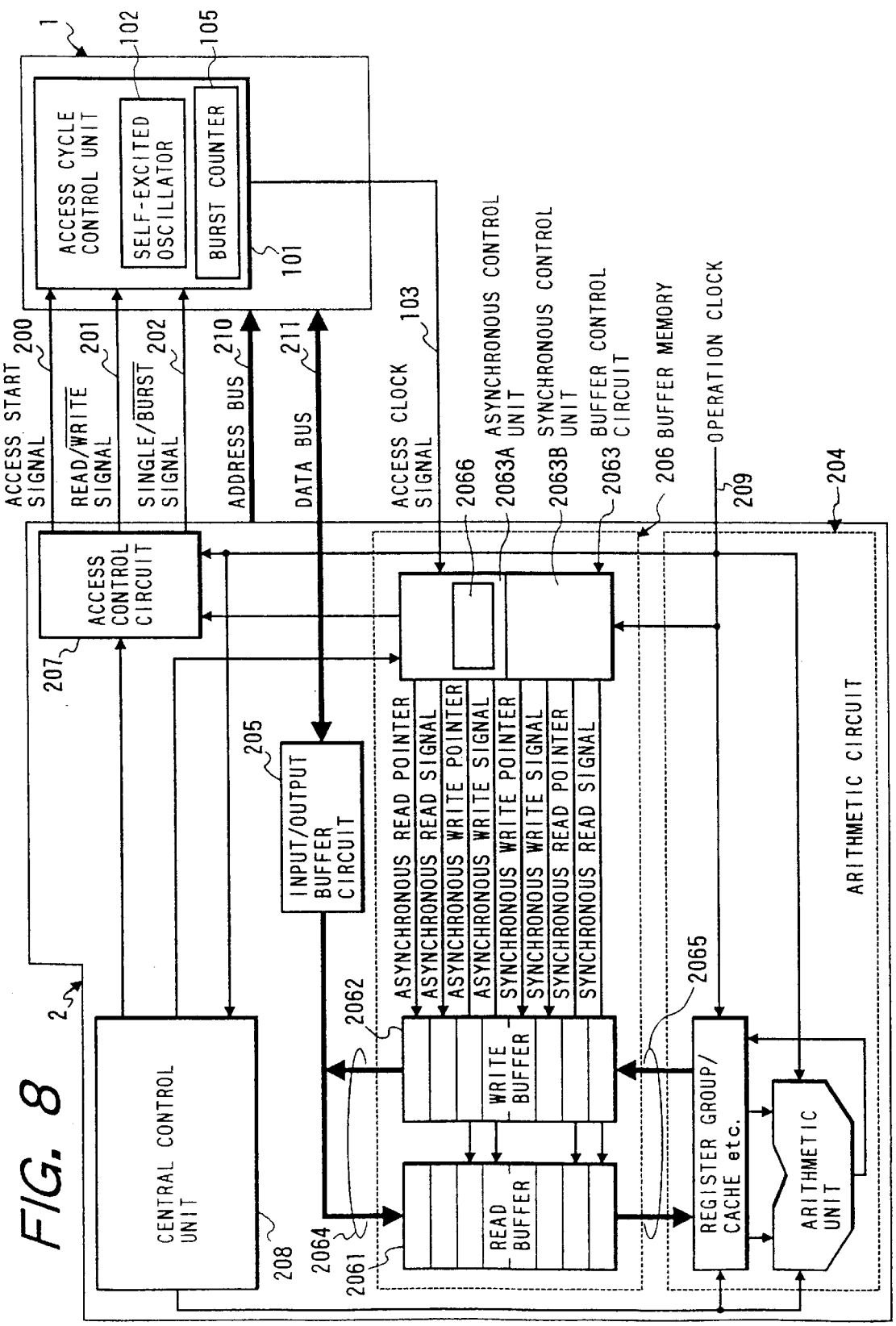
FIG. 8 is a block diagram of one detailed embodiment of the CPU of FIG. 1.

FIG. 8 is a block diagram showing one detailed embodiment of the CPU 2. The CPU 2, as shown, is formed on a semiconductor substrate made of single-crystal silicon, by the well-known semiconductor integrated circuit manufacturing technique, although not limited thereto. The same circuit blocks as those of FIG. 1 are designated at the same reference characters, and their detailed description will be omitted. Here, the buffer memory 206 will be described in detail.

The buffer memory 206 is composed of a read buffer 2061, a write buffer 2062 and a buffer control circuit 2063 of the FIFO (i.e., First-IN First-Out) type. The read buffer 2061 is dedicated to the data transfer in the read direction by the CPU, and the write buffer is dedicated to the data transfer in the write direction by the CPU. Both buffers 2061 and 2062 are equipped with an asymmetric port 2064 to be controlled on the basis of a request request fed from the memory 1 in response to the access clock signal 103; and a synchronous port 2065 to be controlled in synchronism with the internal operation clock 209. The buffer control circuit 2063 is equipped with an asynchronous control unit 2063A for controlling the asynchronous port 2064; and a synchronous control unit 2063B for controlling the synchronous port 2065. The asynchronous port 2064 is connected to the input/output buffer circuit 205, and the synchronous port 2065 can be interfaced with the register group, the cache memory and so on contained in the arithmetic circuit 204.

The asynchronous control unit 2063A feeds the write buffer 2062 with the asynchronous read signal for instructing the read operation and the asynchronous read address (or pointer) of that time, in synchronism with the aforementioned change in the access clock signal 103. In synchronism with this change in the access clock signal 103, moreover, the read buffer 2061 is fed with the asynchronous write signal for instructing the write signal and the asynchronous write address (or pointer) of that time. A choice between the read buffer 2061 and the write buffer 2062 to be accessed in synchronism with the change in the access clock signal 103 depends on the information from the central control unit 208 indicating whether the CPU 2 requests reading or writing corresponding to the access clock signal 103.

The synchronous control unit 2063B is operated as a part of the instruction execution control in the central control unit 208. When the memory read operation is required according to the execution of a data transfer instruction such as a load instruction, a store instruction or a move instruction, the read buffer 2061 is fed with the synchronous read signal for instructing the read operation and the synchronous read address (or pointer) of that time, in synchronism with the operation clock 209. When the memory write operation is required according to the execution of the data transfer instruction, on the other hand, the write buffer 2062 is fed with the synchronous write signal instructing the write operation and the synchronous write address (or pointer) of that time, in synchronism with the operation clock 209. A choice between the read buffer 2061 and the write buffer 2062 to be accessed depends on the instruction decoding signal outputted from the central control unit 208 in accordance with the instruction execution.

The memory 1 of the example of FIG. 8 does not have the function of producing the cycle complete signal 104. A similar function is executed by a burst counter 2066, in the asynchronous control unit 2063A to feed the burst transfer cycle complete to the access control circuit 207. In the CPU 2 of the present embodiment, the count-up signal of the burst counter 2066 is also used for informing the central control unit 208 of the write complete in the read buffer 2061 and the read complete from the write buffer 2062. This operation will be described with reference to FIG. 9.

Figure 9:
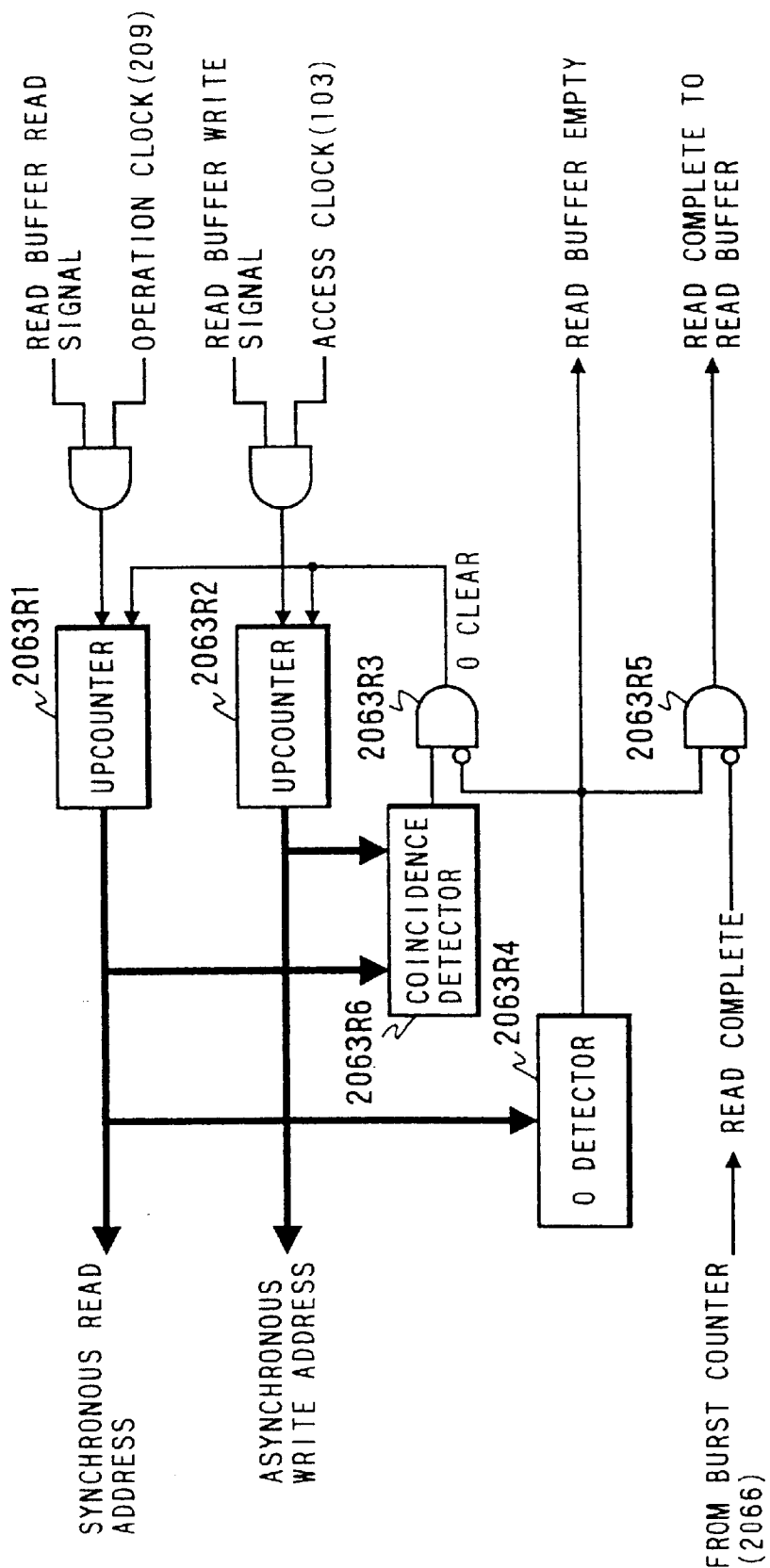
FIG. 9 is a block diagram of one detailed example of a circuit portion relating to a read buffer in the buffer control circuit of FIG. 8.

FIG. 9 is a detailed block diagram of one example of a circuit portion relating to the read buffer 2061 in the buffer control circuit 2063. The synchronous read address of the read buffer 2061 is produced by an upcounter 2063R1, and the asynchronous write address of the read buffer 2061 is produced by an upcounter 2063R2. The upcount operation of the upcounter 2063R2 is performed in synchronism with the timing at which the access clock signal 103 is changed to the high level and at which the read buffer write signal from the central control unit 208 is activated. The up count operation of the upcounter 2063R1 is performed in synchronism with the operation clock 209 when the read buffer read signal from the central control unit 208 is activated. Both the upcounters 2063R1 and 2063R2 are cleared to 0 by the high-level output of the AND gate 2063R3. It is the clearing timing when the outputs of both the upcounters 2063R1 and 2063R2 is detected by a coincidence detector 2063R6 in case the output value of the upcounter 2063R1 is not 0. It is detected by a 0 detector 2063R4 that the output value of the upcounter 2063R1 is 0. In case the output value of the upcounter 2063R1 is 0, the 0 detection result by the 0 detector 2063R4 means the vacancy of the read buffer 2061 and is fed to the central control unit 208. If this state is detected, the central control unit 208 can confirm that the read data from the memory 1 has been wholly transferred to the arithmetic circuit 204. The bust counter 2066, as shown in FIG. 8, detects whether or not the given number of continuous data words transferred is reached. When this number of words is reached, the output of the burst counter 2066 is changed to the high level for a predetermined time period. In the read operation of the memory 1, the change of the output from the burst counter 2066 is fed as a signal meaning the read complete to an AND gate 2063R5. This AND gate 2063R5 detects the read complete of the read buffer 2061, when it receives the signal meaning the read complete if it is detected by the 0 detector 2063R4 that the output of the upcounter 2063R1 is not 0, and transfers the detected read complete to the central control unit 208. When the read complete of the read buffer 2061 is detected, the central control unit 208 can confirm that the read data from the memory 1 is wholly latched in the read buffer 2061 so that the central control unit 208 can read the read data from the read buffer 2061 to start the internal arithmetic operation instantly.

Figure 10:
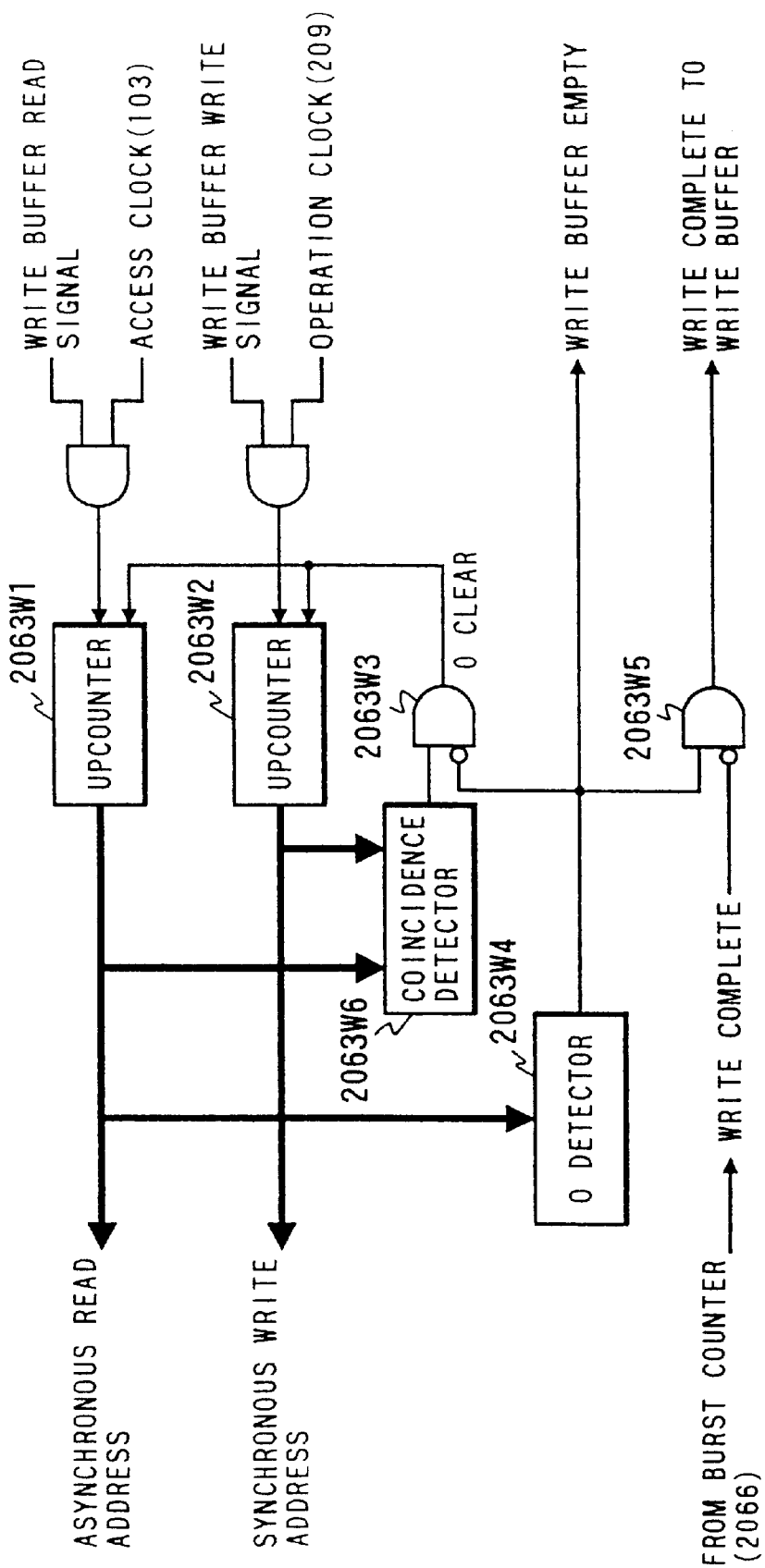
FIG. 10 is a block diagram of one detailed example of a circuit portion relating to a write buffer in the buffer control circuit of FIG. 8.

FIG. 10 is a detailed block diagram of one example of a circuit portion relating to the write buffer 2062 in the buffer control circuit 2063. The synchronous write address of the write buffer 2062 is produced by an upcounter 2063W2, and the asynchronous write address of the write buffer 2062 is produced by an upcounter 2063W1. The upcount operation of the upcounter 2063W1 is performed in synchronism with the timing at which the access clock signal 103 is changed to the high level and at which the write buffer write signal from the central control unit 208 is activated. The upcount operation of the upcounter 2063W2 is performed in synchronism with the operation clock 209 when the write buffer write signal from the central control unit 208 is activated. Both the upcounters 2063W1 and 2063W2 are cleared to 0 by the high-level output of the AND gate 2063W3. It is the clearing timing when the outputs of both the upcounters 2063W1 and 2063W2 is detected by a coincidence detector 2063W6 in case the output value of the upcounter 2063W1 is not 0. It is detected by a 0 detector 2063W4 that the output value of the upcounter 2063W1 is 0. In case the output value of the upcounter 2063W1 is 0, the 0 detection result by the 0 detector 2063W4 means the vacancy of the write buffer 2062 so that the central control unit 208 recognizes the vacant state of the write buffer 2062. In the write operation of the memory 1, the change of the burst counter 2066 to the high level is fed as a signal meaning the write complete to an AND gate 2063W5. This AND gate 2063W5 detects the write complete of the write buffer 2062, when it receives the signal meaning the write complete if it is detected by the 0 detector 2063W4 that the output of the upcounter 2063W1 is not 0, and transfers the detected write complete to the central control unit 208. When the write complete of the write buffer 2062 is detected, the central control unit 208 can confirm that the write data to the memory 1 in response to the response request from the memory is wholly outputted from the write buffer 2062.

Figure 11:
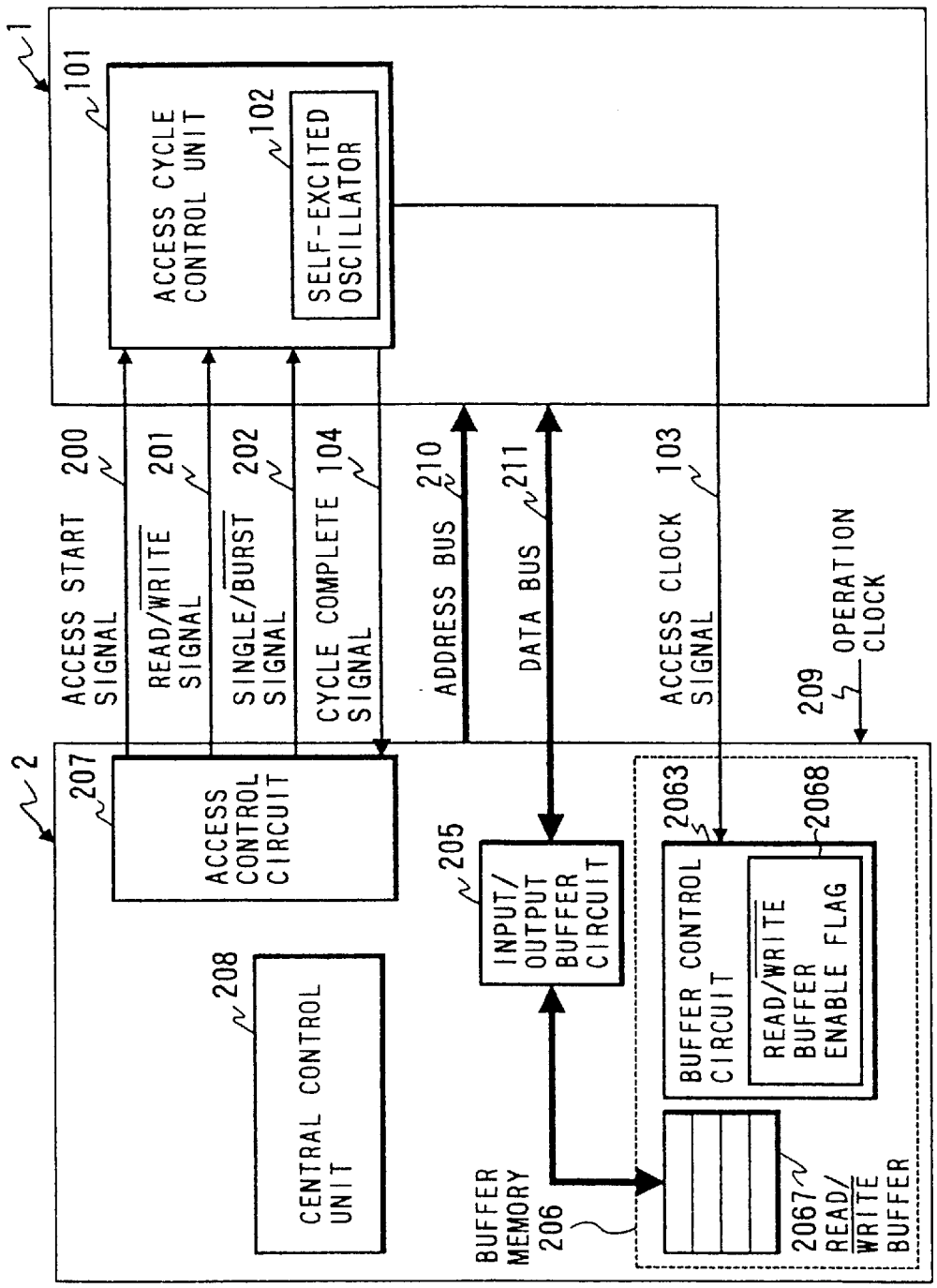
FIG. 11 is a block diagram showing one embodiment of a CPU having a buffer memory of the type sharing a read buffer and a write buffer.

FIG. 11 shows a buffer memory different from the buffer memory 206 shown in FIG. 8. The buffer memory 206, as shown, is equipped with a read/write buffer 2067 which is shared between the read buffer 2061 and the write buffer 2062. The buffer control circuit 2063 is equipped with a read/write buffer enable flag 2068 which is set with the information concerning which of the read buffer or the write buffer the read/write buffer 2067 is to be operated as. The operation of the read/write enable flag 2068 is controlled according to the instruction coming from the central control unit 208. The remaining points are similar to those of FIG. 8, and their detail description will be omitted by designating the same circuit blocks at the same reference characters. This construction contributes to a reduction of the chip area.

Figure 12:
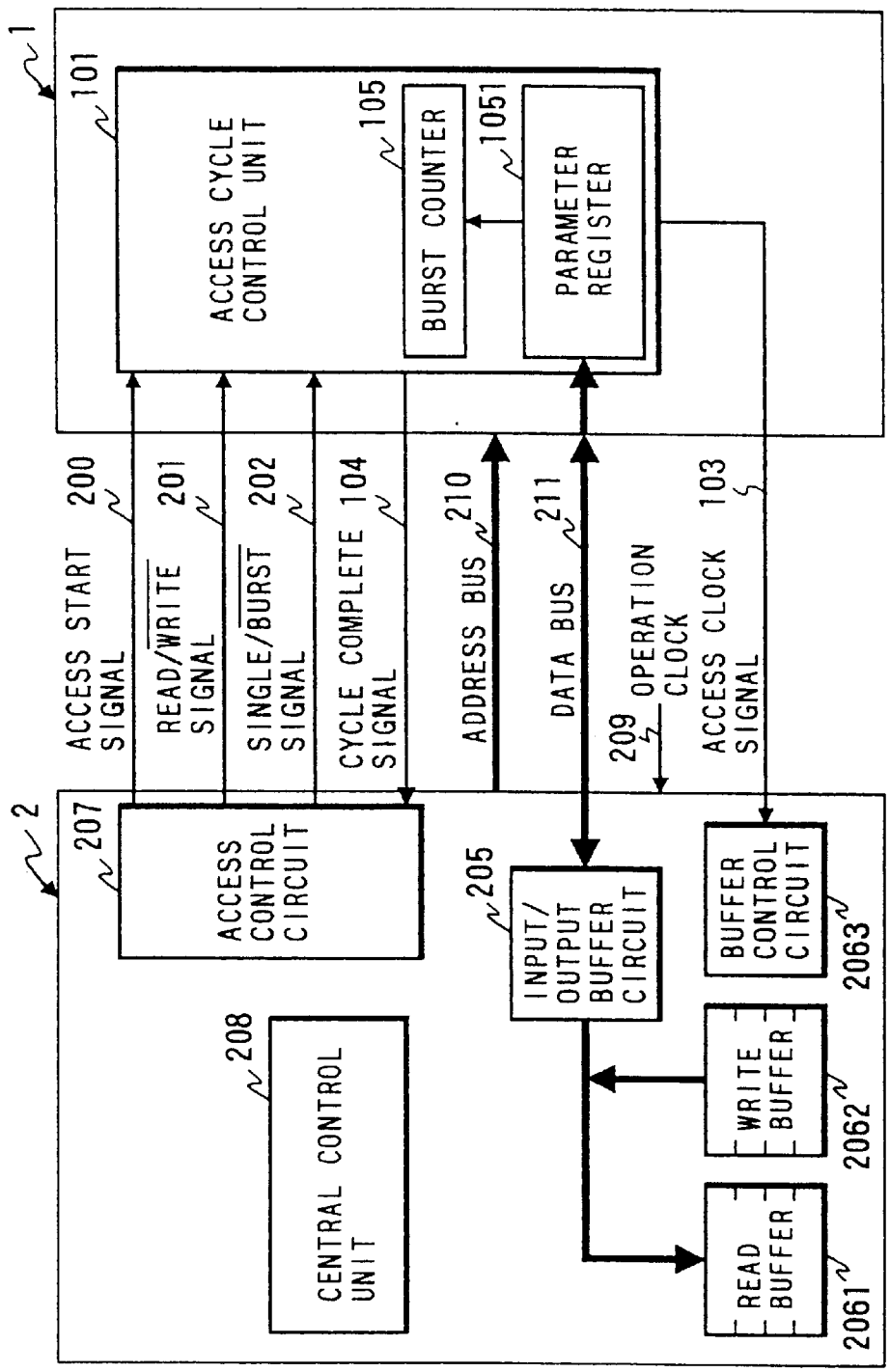
FIG. 12 is a block diagram of one embodiment of a memory in which a burst counter is equipped with a parameter register.

FIG. 12 shows an essential portion of an embodiment having a control parameter register in place of the memory of FIG. 5. Specifically, there is provided a parameter register 1051 for latching in a preset table manner the target number of the continuous data words to be counted by the burst counter 105 of FIG. 6. This parameter register 1051 is controlled by the central control unit 208 of the CPU 2 to transfer a desired parameter (i.e., the information for specifying the number of words for a burst transfer) in a programmable manner. The remaining constructions are similar to those of FIGS. 5 and 6, and the detailed description will be omitted by designating the same circuit blocks at the same reference characters. This raises the degree of freedom of data transfer and the flexibility of the control. Incidentally, the parameter register 1051 can be exemplified by constructing memory stages in a presettable manner in case the memory stages correspond to the number of counted bits.

Figure 13:
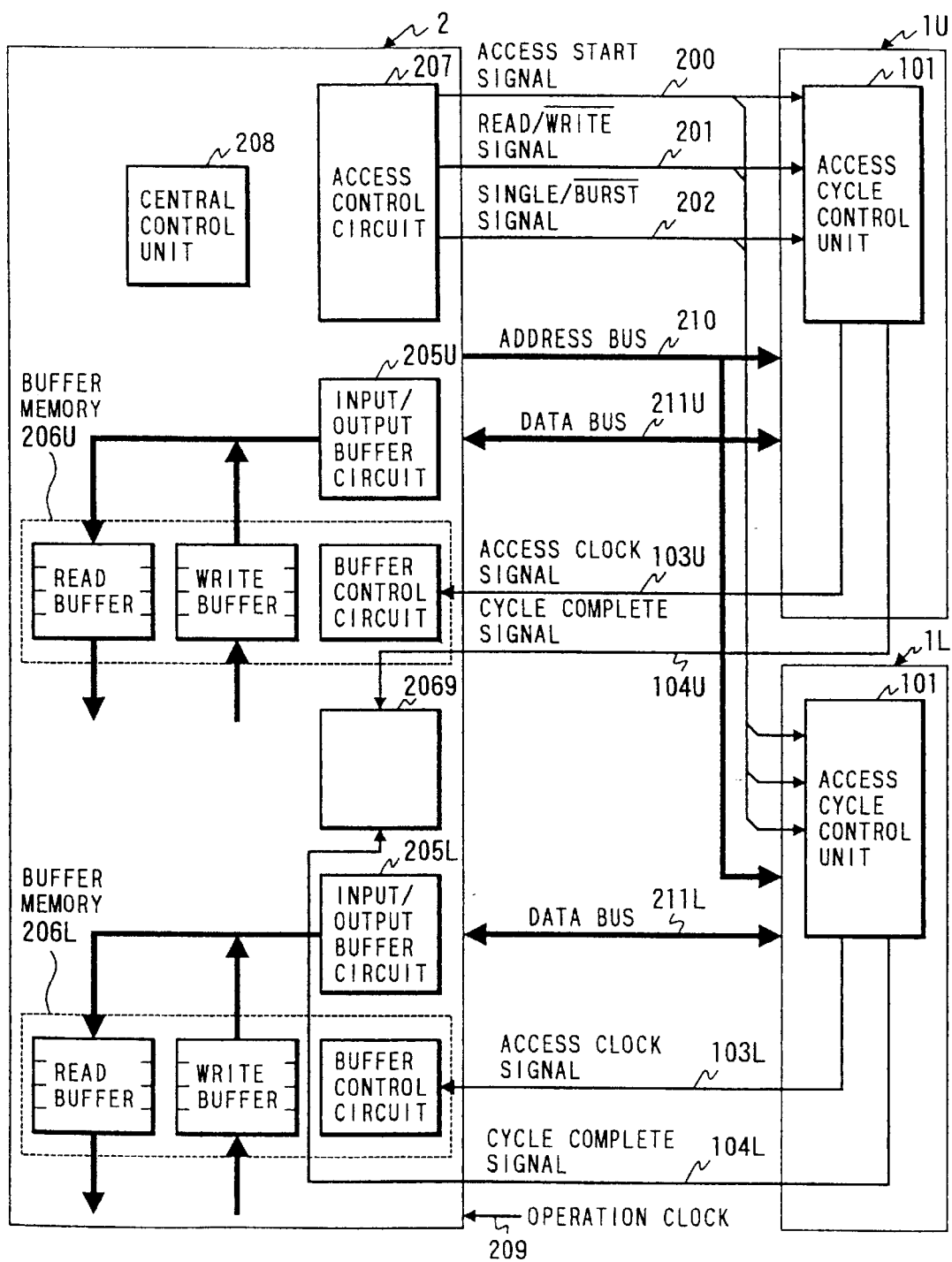
FIG. 13 is a block diagram of one embodiment when identical memories having a function to input/output multiple bits of 1/2n times, for example, as large as the bits of a data but are interfaced with the CPU.

FIG. 13 shows an embodiment which has a multi-bit input/output function of 1/2n bits, for example, for the bit number of the data bus to establish an interface between the same memory and the CPU 2. In this embodiment, the CPU 2 is equipped with a plurality of sets of buffer memories 206 and input/output buffer circuits 205. In case the data bus 211 has 32 bits whereas the memory 1 has 16 parallel input/output bits, the more significant data bus 211U of 16 bits is coupled through an input/output buffer circuit 205U to one memory 1U, whereas the less significant data bus 211L is coupled through an input/output buffer 205L to the other memory 1L. The access start signal 200, the read/write signal 201, the single/burst signal 202 and the address bus 210 are commonly connected with the memories 1U and 1L. An access clock signal 103U is connected with a buffer memory 206U whereas an access clock signal 103L is connected with a buffer memory 206L. Cycle complete signals 104U and 104L are respectively outputted from the memories 1U and 1L and fed to a cycle complete control circuit 2069 to transmit the memory access completes of the two to the access control circuit 207.

The number of parallel input/output bits of the actual memory may be x4, x8, x9, x16 or x18, and the number of parallel data input/output bits of the CPU may be x16, x32, x36, x64 or x72. In order to interface the memory and the CPU in a corresponding manner, it is necessary and important to provide every bits with the buffer memory, as shown in FIG. 13.

Figure 14:
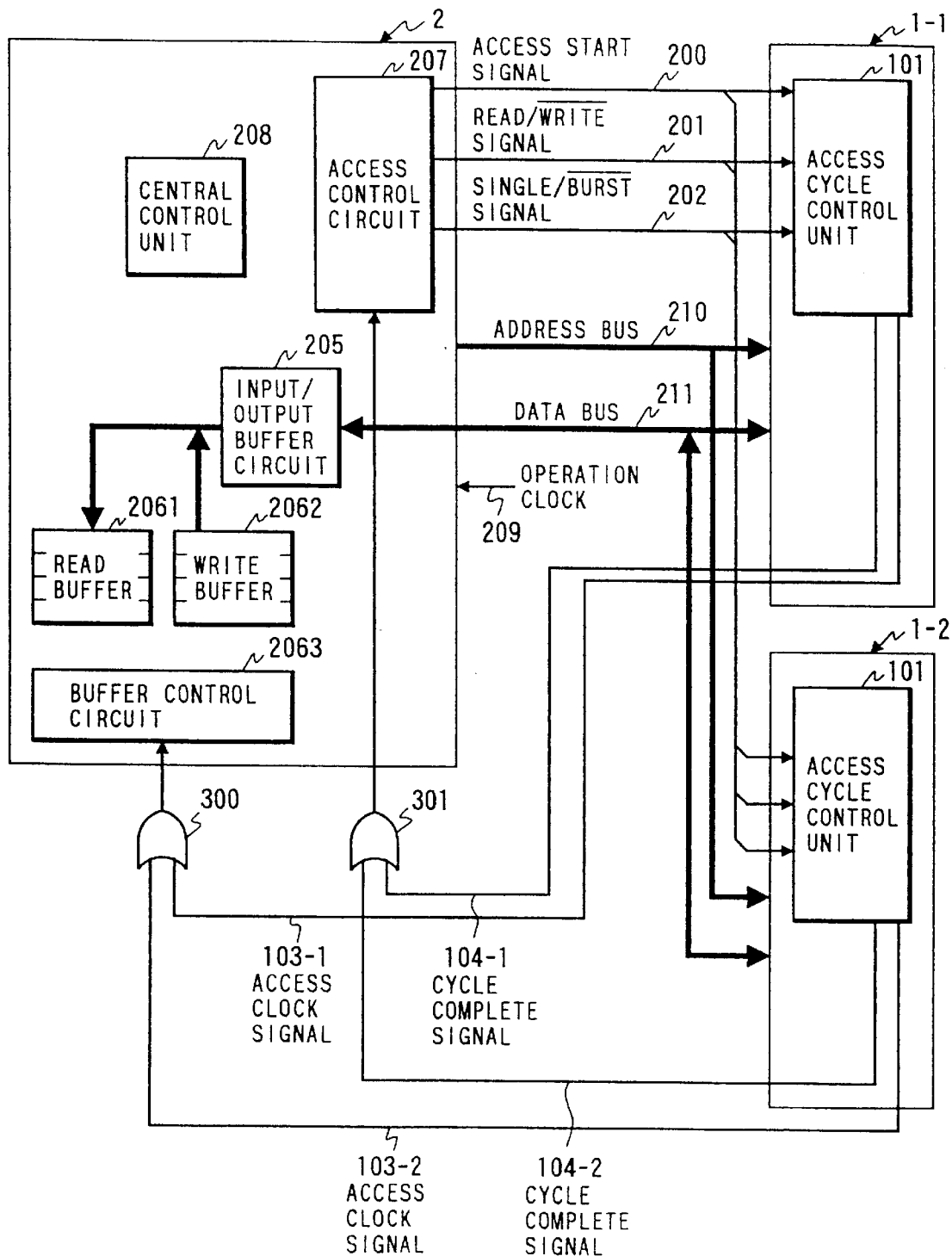
FIG. 14 is a block diagram of one embodiment of the case in which memories having different characteristics/functions are mixed to construct a system.

FIG. 14 shows an embodiment of the case in which memories having different characteristics/functions are mixed to construct the system. In this case, the data transfer can be achieved basically in conformity to an access clock if fine terminal functions or connection conditions are ignored. Thus, an access clock signal 103-1 of a memory 1-1 and an access clock signal 103-2 of a memory 1-2 are coupled through an OR gate 300 to the buffer control circuit 2063 outside the CPU 2. Likewise, an access complete signal 104-1 of the memory 1-1 and an access complete signal 104-2 of the memory 1-2 are coupled through an OR gate 301 to the access control circuit 207 outside the CPU 2. The remaining access start signal 200, read/write signal 201, single/burst signal 202, address bus 210 and data bus 211 are commonly connected with the memories 1-1 and 1-2. As a result, the peripheral circuits such as the memories having the different characteristics/functions can be mixed to construct the system.

Figure 15:
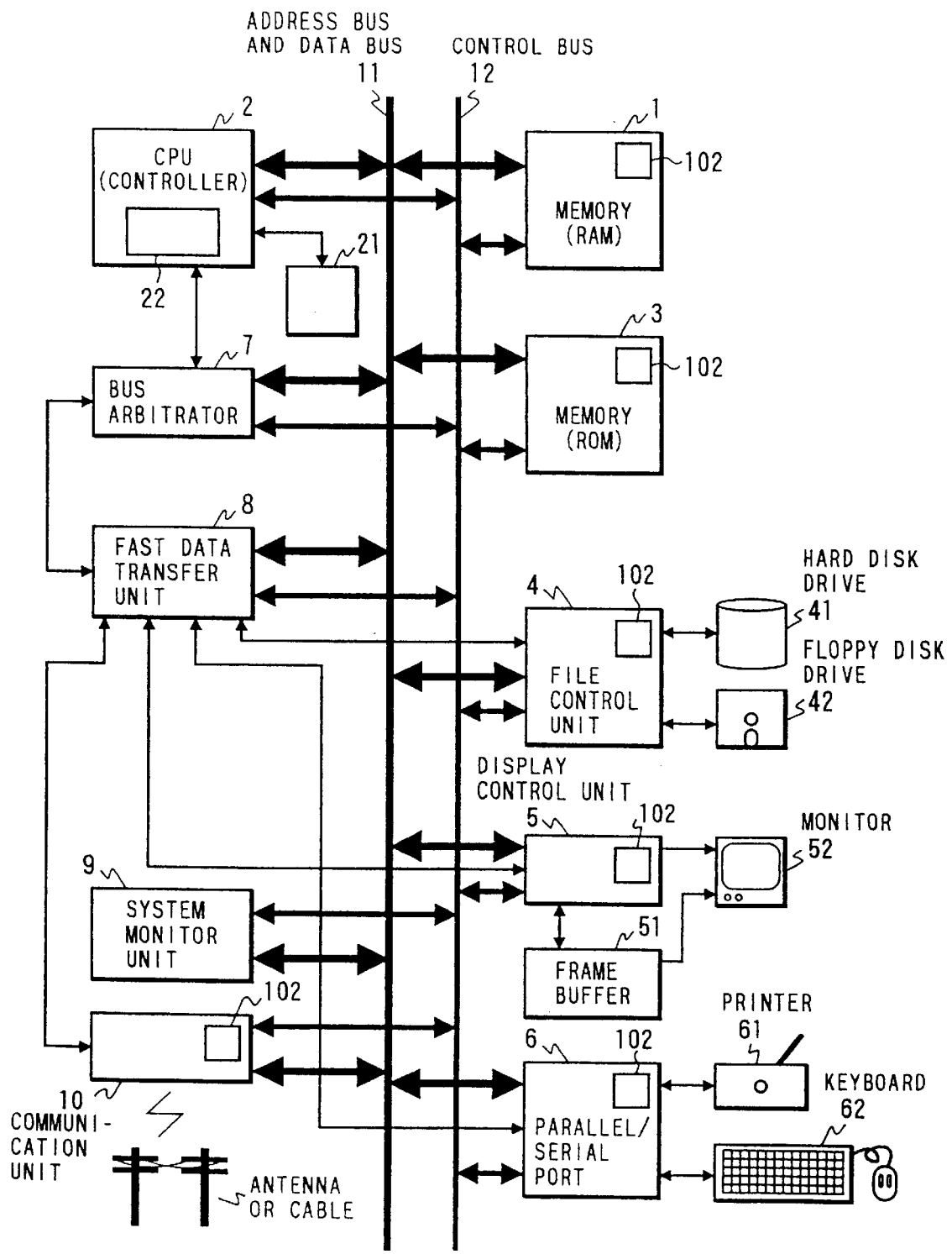
FIG. 15 is an overall block diagram of one embodiment of a data processing system.

FIG. 15 shows one overall embodiment of a data processing system using the CPU 2 and the memory 1, as described in the foregoing embodiments. As the peripheral circuits enabled to perform the data transfer by a protocol similar to that of the memory (e.g., RAM) 1 of the foregoing embodiments, as shown in FIG. 15, there are provided a memory (e.g., ROM) 3; a file control unit 4 to be interfaced with a hard disk drive 41 and a floppy disk drive 42; a display control unit 5 for controlling the drawing of a frame buffer 51 and the display of the drawn data on a monitor 52; a parallel/serial port 6 to be interfaced with a printer 61 and a keyboard 62; and a communication unit 10 for transferring data through an antenna and a cable. These peripheral circuits have their own self-excited oscillators 102 according to their operating characteristics so that the data transfer is realized by returning response requests in response to the access requests from the CPU 2 as in the memory. In FIG. 15, reference numeral 9 designates a system monitor unit for monitoring a system malfunction and the status of the supply voltage by means of a watchdog timer. A fast data transfer unit 8 is a circuit such as a direct memory access controller, and the bus arbitration with the CPU 2 is accomplished by the bus arbitrator 7. The fast data transfer unit 8 performs the data transfer control like that of the CPU 2. Numeral 21 designates an external cache memory intrinsic to the CPU 2 to act as a secondary cache memory for a cache memory 22 in the CPU 2. The data processing system of FIG. 15 is constructed over a packaging board which is formed with address/data buses 11 and a control bus 12.

Since the data processing system of FIG. 15 requires no wait state control for the memories or input/output circuits, neither a memory controller nor an input/output controller is formed on the substrate.

Although our invention has been specifically described in connection with its embodiments, it should not be limited thereto but can naturally be modified in various manners without departing from the gist thereof.

For example, the foregoing embodiments have been described in case the peripheral circuit is exemplified by the memory such as the RAM. However, the peripheral circuit should not be limited thereto but can be applied not only to the peripheral circuit shown in FIG. 15 but also to a variety of other peripheral circuits. Moreover, the application of such peripheral circuit can cover not only a CPU or a direct memory access controller but also a variety of data processors such as a microprocessor, a microcomputer, a single-chip microcomputer or a digital-signal processor.

On the other hand, the buffer memory should not be limited to the perfect dual port buffer as in the foregoing embodiment but can be used as if it acts as a dual port for operating a uni-port buffer memory in a time sharing manner. From the standpoint of the chip area of the data processor, on the other hand, the depth (or storage capacity) of the buffer memory is important, but the much inferior function will have the less contribution to the improvement in the bus rate. Thus, this belongs to the design item which is determined by considering the trade-off from the cost performance. Incidentally, the depth of the buffer memory is thought to aid in simplification of the buffer control circuit if it is restricted to the number of words to be handled by a data transfer of one time (i.e., the maximum number of words of the burst transfer).

The effects to be obtained by the representative of the invention disclosed herein will be briefly described in the following.

Specifically, the peripheral circuit is operated in synchronism with the output signal from its own self-excited oscillator and asynchronously of the operation clock signal of the data processor which sends an access request to that peripheral circuit. In this relation, the interface between their data is realized the mutually equivalent access requests and the response requests in response to the access request. As a result, a series of data transfer time periods, which have been limited in the prior art to an integer times as high as the fundamental operation clock of the data processor, can be determined according to the clock cycle of the response request depending upon the self-excited oscillation frequency which is produced according to the characteristics such as the operating speed of the peripheral circuit such as the memory.

From the above discussion, it is easy to realize the data transfer for the limit time periods of the individual characteristics of the peripheral circuit and the data processor. In other words, it is possible to reduce the unnecessary time period spent for synchronization with the operation clock of the data processor, as has been troubled in the prior art.

From the above discussion, moreover, the wait state control circuit for the interface between the data processor and each of the peripheral circuits can be dispensed with to simplify the circuit connecting means.

The data processor equipped on the common chip with the buffer memory to be interfaced with the peripheral circuit can internally absorb the difference in the data transfer rate between the internal unit of the data processor and the outside to shorten the time period for the sequential standby in the processing of the read data and the write data by the access request.

Thus, the data processing system can be freely constructed by interfacing the data processor with a plurality of peripheral circuits of different kinds and by interfacing mutually identical peripheral circuits having a multi-bit input/output functions of 1/2n bits for the bit number of the data bus with the data processor.

What is claimed is:

1. A controller formed on a semiconductor substrate for use with an external memory which is formed on a semiconductor substrate, and which has a terminal arranged to output a signal in a burst read cycle, the controller comprising:

an input terminal;

a control circuit; and a buffer memory including a read buffer, wherein the input terminal is arranged to receive the signal outputted from the terminal of the external memory, wherein the control circuit is arranged to output a first signal to a chip select signal input terminal of the external memory, and to output a second signal to a write enable signal input terminal of the external memory, wherein the controller is arranged to receive data from data input/output terminals of the external memory, and to latch the data by a signal based on the signal received on the input terminal, and wherein the read buffer has a plurality of stages and is arranged to store the latched data.

2. A controller formed on a semiconductor substrate for use with an external memory which is formed on a semiconductor substrate, said controller comprising:

a first terminal arranged to output a first signal to a chip select signal input terminal of said external memory;

a second terminal arranged to output a second signal to a write enable signal input terminal of said external memory;

a third terminal arranged to receive continuous data from a data input/output terminal of said external memory;

a fourth terminal arranged to receive signals from said external memory, said signals being aligned with said continuous data; and a buffer memory having a plurality of stages and arranged to store said continuous data.

3. A controller according to claim 2, wherein said external memory is a Random Access Memory having a function of burst read.

4. A controller formed on a semiconductor substrate for use with an external memory which is formed on a semiconductor substrate, said controller comprising:

a first terminal arranged to output a first signal to a Chip Select terminal of said external memory;

a second terminal arranged to output a second signal to a Write Enable terminal of said external memory;

a third terminal arranged to receive continuous data from a data terminal of said external memory;

a fourth terminal arranged to receive signals from said external memory, said signals being in synchronism with said continuous data; and a buffer memory having a plurality of stages and arranged to store said continuous data.

5. A controller according to claim 4, wherein said external memory is a Random Access Memory having a function of burst read.

* * * * *